(12) United States Patent
Miller

(10) Patent No.: US 7,808,287 B2
(45) Date of Patent: Oct. 5, 2010

(54) FREQUENCY DIVIDER CIRCUITS

(75) Inventor: Robin James Miller, Hampshire (GB)

(73) Assignee: Future Waves UK Limited, London (GB)

( * ) Notice: Subject to any disclaimer, the term of this patent is extended or adjusted under 35 U.S.C. 154(b) by 93 days.

(21) Appl. No.: 12/161,945

(22) PCT Filed: Jan. 15, 2007

(86) PCT No.: PCT/GB2007/050016

§ 371 (c)(1),
(2), (4) Date: Oct. 7, 2008

(87) PCT Pub. No.: WO2007/085867

PCT Pub. Date: Aug. 2, 2007

(65) Prior Publication Data

US 2009/0251176 A1    Oct. 8, 2009

Related U.S. Application Data

(60) Provisional application No. 60/761,363, filed on Jan. 24, 2006.

(30) Foreign Application Priority Data

Mar. 3, 2006    (GB)    ................................ 0604263.4

(51) Int. Cl.
*H03K 25/00*    (2006.01)
(52) U.S. Cl. ........................ 327/115; 327/117
(58) Field of Classification Search ................. 327/115, 327/117
See application file for complete search history.

(56) References Cited

U.S. PATENT DOCUMENTS 5,148,050 A * 9/1992 Koide ......................... 327/115

(Continued)

FOREIGN PATENT DOCUMENTS

EP    0903859 A2    3/1999

(Continued)

OTHER PUBLICATIONS

International Search Report for International Application No. PCT/GB2007/050016, Apr. 18, 2007.

(Continued)

*Primary Examiner*—Hai L Nguyen
(74) *Attorney, Agent, or Firm*—Caesar, Rivise, Bernstein, Cohen & Pokotilow, Ltd.

(57) ABSTRACT

A circuit for deriving an output clock signal from an input clock signal, the output clock signal having a frequency which is 1/Nth of the frequency of the input clock signal, where N is an odd number. The circuit comprises a plurality of latches configured as a latch ring, the latches being arranged in successive pairs, each pair of latches comprising a first latch that switches on one of the rising or falling edge of the input clock signal, and a second latch that switches on the other of the rising or falling edge of the input clock signal. An RS flip flop is coupled to receive at one of its set and reset inputs an output from the latch ring that is switched on a rising edge, and at the other of the set and reset inputs an output from the latch ring that is switched on a falling edge. Said output clock signal is provided at an output of the RS flip flop.

14 Claims, 4 Drawing Sheets

U.S. PATENT DOCUMENTS

| | | | |
|---|---|---|---|
| 6,061,418 A | 5/2000 | Hassoun | |
| 6,067,339 A | 5/2000 | Knapp | |
| 6,424,691 B1 | 7/2002 | Neravetla | |
| 6,570,417 B2 * | 5/2003 | Choi et al. | 327/115 |
| 6,847,239 B2 * | 1/2005 | Leifso et al. | 327/117 |
| 7,342,425 B1 * | 3/2008 | Kang | 327/115 |
| 2005/0110532 A1 | 5/2005 | Kuroki | |

FOREIGN PATENT DOCUMENTS

| | | |
|---|---|---|
| GB | 2041591 A | 9/1980 |
| JP | 59221031 A | 12/1984 |

OTHER PUBLICATIONS

Search Report for Application No. GB 0604263.4, Jun. 14, 2006.

* cited by examiner

| Divide by 6 State | D0 | Q0 | D1 | Q1 | D2 | Q2 |
|---|---|---|---|---|---|---|
| 0 | 1 | 0 | 0 | 0 | 0 | 0 |
| 1 | 1 | 1 | 1 | 0 | 0 | 0 |
| 2 | 1 | 1 | 1 | 1 | 1 | 0 |
| 3 | 0 | 1 | 1 | 1 | 1 | 1 |
| 4 | 0 | 0 | 0 | 1 | 1 | 1 |
| 5 | 0 | 0 | 0 | 0 | 0 | 1 |
| | D0=/Q2 | | D1=Q0 | | D2=Q1 | |
| Divide by 5 | | | | | | |
| 0 | 1 | 0 | 0 | 0 | 0 | 0 |
| 1 | 1 | 1 | 1 | 0 | 0 | 0 |
| 2 | 0 | 1 | 1 | 1 | 1 | 0 |
| 3 | 0 | 0 | 0 | 1 | 1 | 1 |
| 4 | 0 | 0 | 0 | 0 | 0 | 1 |
| | D0=/Q1./Q2 | | D1=Q0 | | D2=Q1 | |

FREQUENCY DIVIDER CIRCUITS

CROSS-REFERENCE TO RELATED APPLICATIONS

This national stage application claims the benefit under 35 U.S.C. §371 of International Application No. PCT/GB2007/050016 filed on Jan. 15, 2007, entitled FREQUENCY DIVIDER CIRCUITS, which takes its priority from U.S. Provisional Application No. 60/761,363 filed on Jan. 24, 2006 and also takes its priority from GB Application No. 0604263.4 filed on Mar. 3, 2006, and all of whose entire disclosures are incorporated by reference herein.

FIELD OF THE INVENTION

The present invention relates to a frequency divider circuits, and in particular, though not necessarily, to frequency divider circuits based upon a Johnson ring architecture.

BACKGROUND TO THE INVENTION

Digital processing circuits require one or more clock signals to function. Clock signals are typically derived from a fundamental clock signal provided by a crystal oscillator. For example, a clock signal having a frequency lower than that of the fundamental clock signal can be obtained by dividing the fundamental clock signal by an appropriate amount. In circuits where multiple clock signals are required, these can be obtained in an efficient manner by chaining together a set of frequency dividers. For example, if the fundamental frequency is $f_o$, frequencies $f_o/2$ and $f_o/4$ may be obtained by applying the fundamental clock signal to a divide-by-2 circuit and applying the output of that circuit to a further divide-by-2 circuit.

FIG. 1 illustrates schematically a typical divide-by-6 circuit which is based on a Johnson ring. The circuit comprises a chain of three D-type flip flops. Each flip flop comprises a pair of D-type latches (not illustrated in the Figure), where the first member of each pair receives the clock signal to be divided, whilst the second member of each pair receives the inverted clock signal. This clocking arrangement results in the first member of each latch pair changing its state on the rising edge of a clock pulse and the second member of each pair changing its state on the falling edge, thus ensuring that the input to a given latch is in a steady state when that latch is clocked. The inverted output from the final flip flop fed back as the D input to the first latch. This arrangement results in sequences of 0's and 1's being clocked through the chain in turn. The output of the circuit is provided either by Q or /Q of the final flip flop.

A problem arises where it is required to obtain a clock signal which is an odd number division of the fundamental clock signal frequency, i.e. where we need a divide-by-N circuit where N is an odd number. FIG. 2 illustrates schematically a divide-by-5 circuit (based upon the divide-by-6 circuit of FIG. 1). The circuit of FIG. 1 is modified by the inclusion of an AND gate ("&") which receives at its inputs the inverted outputs of the second and third flip flops. The output of the AND gate provides the input to the first flip flop. This configuration causes a "0" to be clocked into the input of the first flip flop, one clock pulse earlier than would otherwise have happened. The pulse sequence through the counter is therefore three "0"s followed by two "1"s. However, it will be appreciated that the duty cycle of this circuit is 40%. This is not suitable for many applications.

For the purpose of illustration, FIG. 3 show the state tables for the divide-by-6 and divide-by-5 counters of FIGS. 1 and 2. FIG. 4 shows the corresponding state diagrams.

SUMMARY OF THE INVENTION

It is an object of the present invention to provide a divide-by-N counter which is able to generate an output signal having a duty cycle of 50%, where N is an odd number.

According to a first aspect of the present invention there is provided a circuit for deriving an output clock signal from an input clock signal, the output clock signal having a frequency which is 1/Nth of the frequency of the input clock signal, where N is an odd number, the circuit comprising:

a plurality of latches configured as a latch ring, the latches being arranged in successive pairs, each pair of latches comprising a first latch that switches on one of the rising or falling edge of the input clock signal, and a second latch that switches on the other of the rising or falling edge of the input clock signal; and a memory element coupled to receive at one of its set and reset inputs an output from the latch ring that is switched on a rising edge of the input clock signal, and at the other of the set and reset inputs an output from the latch ring that is switched on a falling edge of the input clock signal, said output clock signal being provided at an output of the memory element.

In an embodiment of the invention, said latches are D-type latches. Each said pair of latches provides a D-type flip flop. The number of latches in the latch ring is N+1.

In an embodiment of the invention, the set input of the RS flip flop is coupled to an output of an AND gate. Inputs of the AND gate are coupled to respective outputs of two latches that are both triggered by the rising edge of the input clock signal, or by the falling edge. More preferably, said two latches are the second latches of successive latch pairs in the ring. The reset input of the memory element is preferably coupled to an output of a first latch of one of the latch pairs.

In an embodiment of the present invention, said circuit is programmable to set the value of N from a plurality of values including odd and even values. The circuit may comprise a first multiplexer having an input coupled to the output of said AND gate, and one or more further inputs coupled to respective outputs of latch pairs. The circuit may comprise a second multiplexer having a first input coupled to an output of said memory element, and a second input coupled to an output of one of the latch pairs. The multiplexers are controlled to provide at their outputs one of the signals provided at their inputs.

Preferably, the memory element is an edge triggered device. More preferably, the memory element is an RS flip flop.

According to a second aspect of the present invention there is provided a method of generating a clock signal having a frequency which is 1/Nth of the frequency of an input clock signal, where N is an odd number, using a plurality of latches configured as a latch ring, the latches being arranged in successive pairs, each pair of latches comprising a first latch that switches on one of the rising or falling edge of the input clock signal, and a second latch that switches on the other of the rising or falling edge of the input clock signal, the method comprising:

setting the output of a memory element using an output from the latch ring that is switched on one of a rising or falling edge of the input clock signal, and resetting the memory element on the other of the rising or falling edge of the input clock signal, said output clock signal being provided at an output of the RS flip flop.

BRIEF DESCRIPTION OF THE DRAWINGS

FIG. 3 is a state table for the circuits of FIGS. 1 and 2;

FIG. 5 is a state table for the circuit of FIG. 5 when programmed as a divide-by-5 circuit.

DETAILED DESCRIPTION OF CERTAIN EMBODIMENTS OF THE INVENTION

Figure 2:
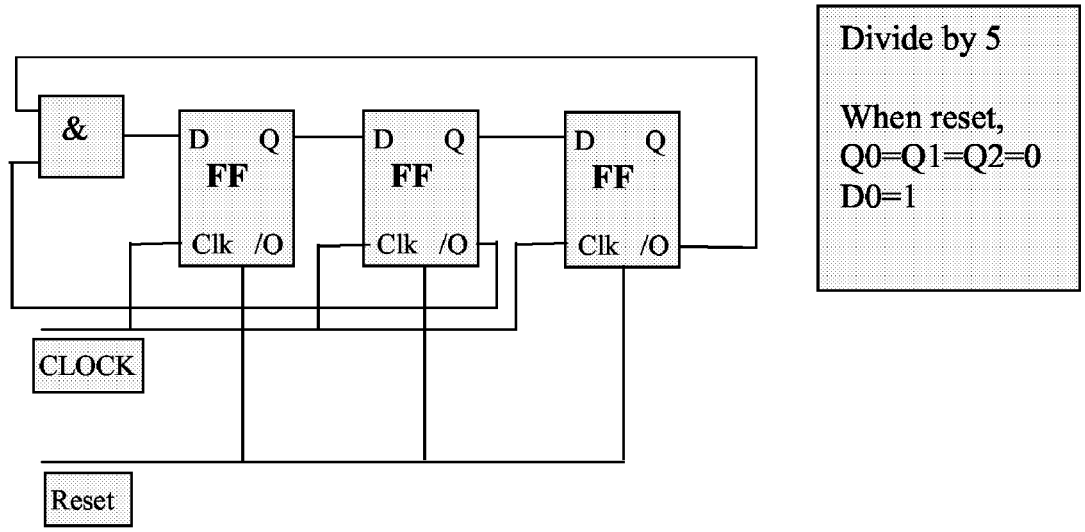
FIG. 2 illustrates schematically a conventional divide-by-5 circuit of the Johnson ring type.
Figure 4:
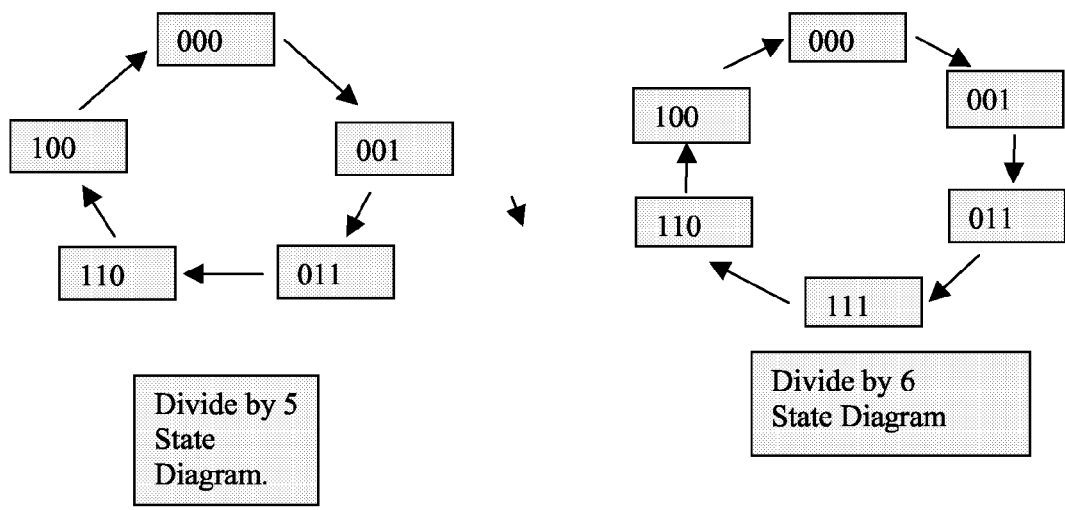
FIG. 4 illustrates state diagrams for the circuits of FIGS. 1 and 2.
Figure 5:
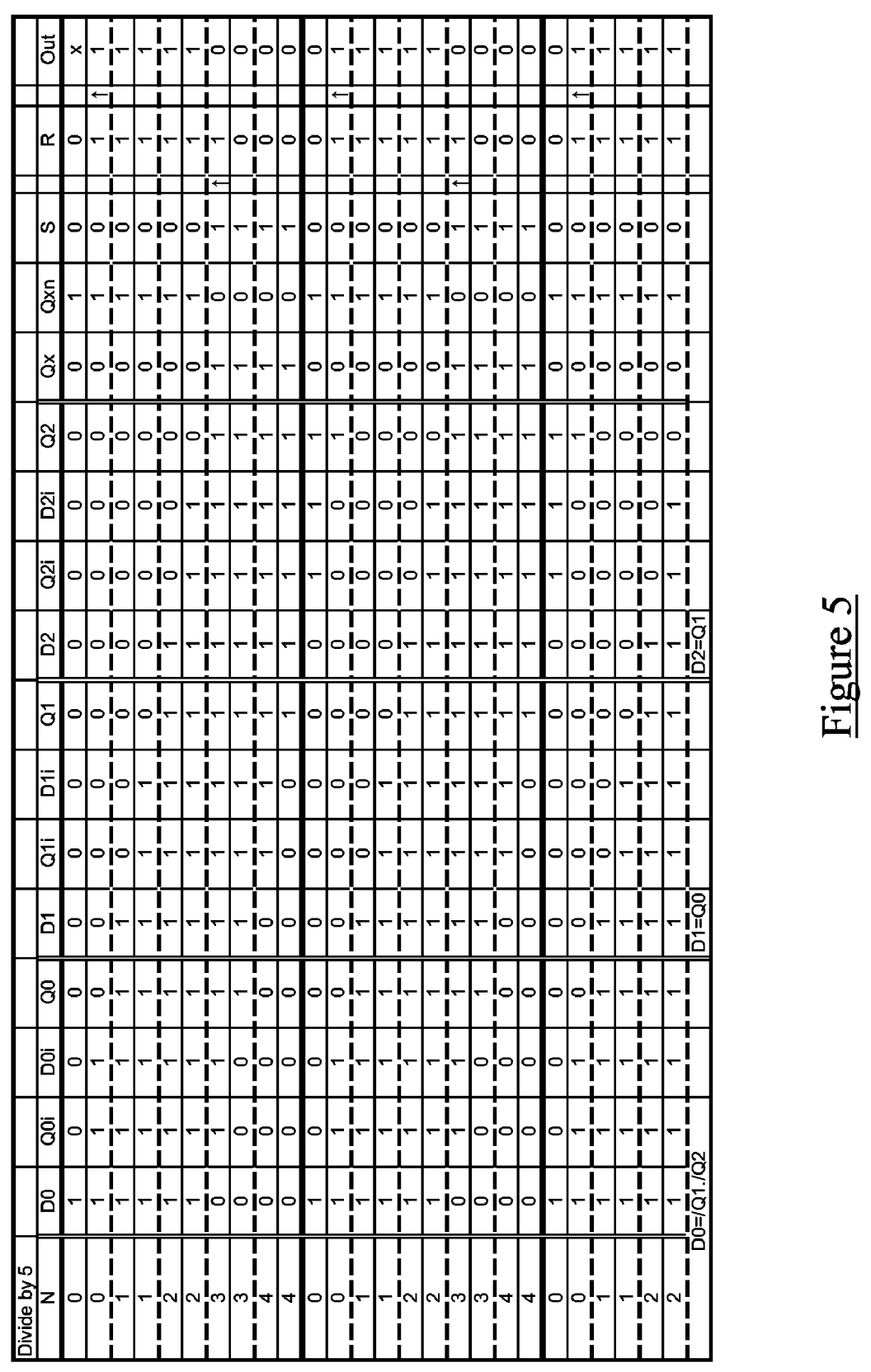

FIG. 5 illustrates the state table for the divide-by-5 circuit of FIG. 2, but this time showing the states within each of the flip flops, i.e. the states for the individual D-type latches. The left hand column "N" shows the count, split into half clock pulses. In order to obtain an output with a 50% duty cycle, the output must be switched between counts (i.e. clock pulses) 4 and 0, and midway through count 2. We need to identify edges within the state table that can be used to generate appropriate switching signals. For the purpose of this example, we make use of the transition of the input to the first latch D0 from 0 to 1, and the transition of the input to the second latch D0i from 1 to 0.

Figure 6:
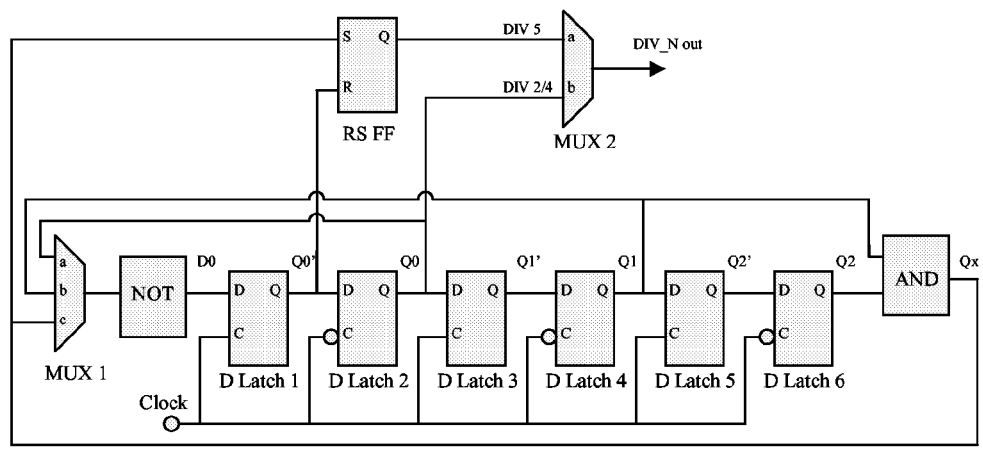
FIG. 6 illustrates schematically a programmable divide-by-2, 4, or 5 circuit according to an embodiment of the present invention.

There is illustrated in FIG. 6 a divider circuit which is programmable to provide an output clock signal (DIV_N out) having a clock frequency which is 1/Nth of the frequency of an input clock signal (Clock). According to this architecture, N may be 2, 4, or 5.

Figure 1:
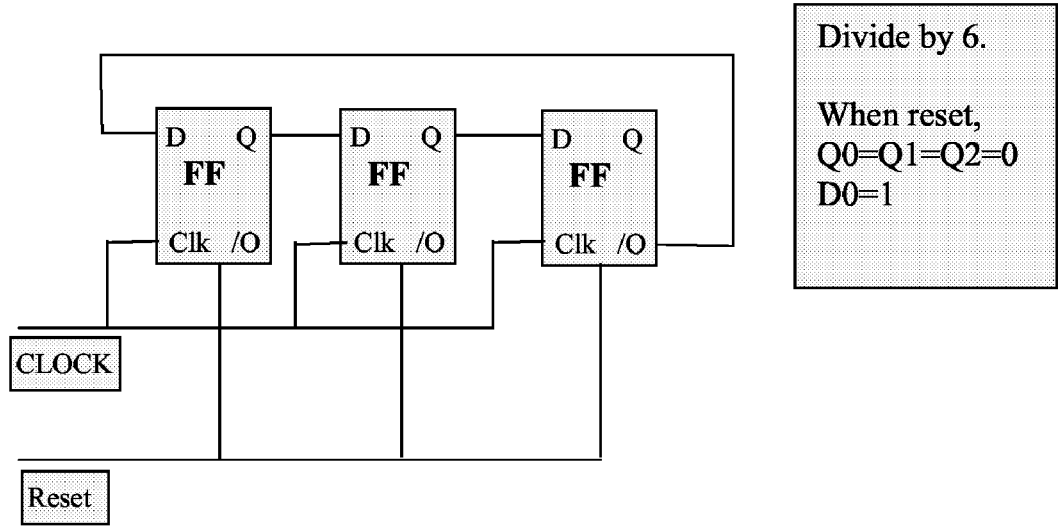
FIG. 1 illustrates schematically a conventional divide-by-6 circuit of the Johnson ring type.

The circuit of FIG. 5 comprises a set of six D-type latches arranged in a chain. The latches are arranged in pairs as described above with reference to FIG. 1. The output Q2 from the final latch (D Latch 6) provides one input to an AND gate (AND). The other input to the AND gate is provided by the output (Q1) of the fourth latch (D Latch 4). The output Qx of the AND gate is fed back as one input (c) to a programmable multiplexer (MUX 1). Other inputs (b) and (c) to the multiplexer (MUX 1) are respectively the output (Q1) of the fourth latch (D Latch 4), and the output (Q0) of the second latch. An RS flip flop (RS FF) receives at its Set input (S) the output (Qx) of the AND gate, and at its Reset input (R) the output (Q0') of the first latch (D Latch 1). A second programmable multiplexer (MUX 2) receives at a first input (a) the output Q of the RS flip flop, and at a second input (b) the output Q0 of the second latch (D Latch 2).

The circuit of FIG. 6 operates as follows.

Divide-by-2

Muliplexer MUX 1 is switched to input (a) and multiplexer MUX 2 is switched to input (b). Latches D Latch 3 to D Latch 6 are powered down, as are the RS flip flop and the output AND gate. The circuit effectively becomes a two latch counter, providing at the output of MUX 2 a divide-by-2 clock signal having a 50% duty cycle.

Divide-by-4

Muliplexer MUX 1 is switched to input (b) and multiplexer MUX 2 is switched to input (b). Latches D Latch 5 and D Latch 6 are powered down, as are the RS flip flop and the output AND gate. The circuit effectively becomes a four latch counter, providing at the output of MUX 2 a divide-by-4 clock signal having a 50% duty cycle.

Divide-by-5

In this circuit configuration all components are powered on. Multiplexer MUX 1 is switched to input (c), whilst multiplexer MUX 2 is switched to input (a). The state table for this configuration is illustrated in the table of FIG. 6. The configuration is such that the output of the SR flip flop is switched from 0 to 1 by the output Qx switching from 0 to 1, and from 1 to 0 by the output Q0' switching from 0 to 1. The former occurs on a falling clock pulse, whilst the latter occurs on a rising clock pulse. Switching on the basis of Q0' results in the resetting of the RS flip flop being delayed by half a clock cycle as compared to resetting on the basis of Qx. (With reference to the state table of FIG. 5, it is noted that Qx and Q0' both have a "0" value at certain states. Whilst this is normally forbidden for an SR flip flop, the timing of the circuit is configured such that problems do not arise.)

The state table of FIG. 5 additionally shows the output Qx of the AND gate, the set and reset inputs (S and R) to the RS flip flop, and the final clock output (Out) of the circuit, for the case where the circuit is configured as a divide-by-5 circuit.

It will be appreciated by the person of skill in the art that various modifications may be made to the above described embodiment without departing from the present scope of the invention. For example, whilst the embodiment described above makes use of D-type flip flop, an arrangement of JK flip flops may be used instead.

What is claimed is:

1. A circuit for deriving an output clock signal from an input clock signal, the output clock signal having a frequency which is 1/Nth of the frequency of the input clock signal, where N is an odd number, the circuit comprising:

a plurality of latches configured as a latch ring, the latches being arranged in successive pairs, each pair of latches comprising a first latch that switches on one of the rising or falling edge of the input clock signal, and a second latch that switches on the other of the rising or falling edge of the input clock signal; and a memory element having set and reset inputs for setting and resetting an output of the element, the element being coupled to receive at one of its set and reset inputs an output from the latch ring that is switched on a rising edge of the input clock signal, and at the other of the set and reset inputs an output from the latch ring that is switched on a falling edge of the input clock signal, said output clock signal being provided at said output of the memory element.

2. A circuit according to claim 1, wherein the number of latches in the latch ring is N+1.

3. A circuit according to claim 1, wherein said latches are D-type latches.

4. A circuit according to claim 3, wherein each said pair of latches provides a D-type flip flop.

5. A circuit according to claim 1, wherein the set input of the memory element is coupled to an output of an AND gate.

6. A circuit according to claim 5, wherein the inputs of the AND gate are coupled to respective outputs of two latches that are both triggered by the rising edge of the input clock signal, or by the falling edge.

7. A circuit according to claim 6, wherein said two latches are the second latches of successive latch pairs in the ring.

8. A circuit according to claim 1, wherein the reset input of the memory element is coupled to an output of a first latch of one of the latch pairs.

9. A circuit according to claim 1, the circuit being programmable to set the value of N from a plurality of values including odd and even values.

10. A circuit according to claim 9 wherein the set input of the memory element is coupled to an output of an AND gate, the circuit comprising a multiplexer having an input coupled to the output of said AND gate, and one or more further inputs coupled to respective outputs of latch pairs.

11. A circuit according to claim 1, the circuit comprising a multiplexer having a first input coupled to an output of said memory element, and a second input coupled to an output of one of the latch pairs.

12. A circuit according to claim 1, wherein said memory element is an edge triggered device.

13. A circuit according to claim 1, wherein said memory element is an RS flip flop.

14. A method of generating a clock signal having a frequency which is 1/Nth of the frequency of an input clock signal, where N is an odd number, using a plurality of latches configured as a latch ring, the latches being arranged in successive pairs, each pair of latches comprising a first latch that switches on one of the rising or falling edge of the input clock signal, and a second latch that switches on the other of the rising or falling edge of the input clock signal, the method comprising:

setting the output of a memory using an output from the latch ring that is switched on one of a rising or falling edge of the input clock signal, and resetting the output of the memory element on the other of the rising or falling edge of the input clock signal, said output clock signal being provided at an output of the memory element.

* * * * *